(12) United States Patent
Kisaki et al.

(10) Patent No.: US 10,355,665 B2
(45) Date of Patent: Jul. 16, 2019

(54) ELECTRONIC COMPONENT HOUSING PACKAGE, ELECTRONIC APPARATUS, AND ELECTRONIC MODULE

(71) Applicant: KYOCERA Corporation, Kyoto-shi, Kyoto (JP)

(72) Inventors: Takuo Kisaki, Kyoto (JP); Masaki Suzuki, Kyoto (JP)

(73) Assignee: Kyocera Corporation, Kyoto (JP)

( * ) Notice: Subject to any disclaimer, the term of this patent is extended or adjusted under 35 U.S.C. 154(b) by 93 days.

(21) Appl. No.: 15/570,900

(22) PCT Filed: Nov. 17, 2016

(86) PCT No.: PCT/JP2016/084125
§ 371 (c)(1),
(2) Date: Oct. 31, 2017

(87) PCT Pub. No.: WO2017/090508
PCT Pub. Date: Jun. 1, 2017

(65) Prior Publication Data
US 2018/0358949 A1    Dec. 13, 2018

(30) Foreign Application Priority Data
Nov. 25, 2015   (JP) ................................. 2015-229783

(51) Int. Cl.
*H01L 41/053*   (2006.01)
*H01L 41/047*   (2006.01)
(Continued)

(52) U.S. Cl.
CPC ......... *H03H 9/02086* (2013.01); *H01L 23/02* (2013.01); *H01L 23/04* (2013.01);
(Continued)

(58) Field of Classification Search
CPC ............ H03H 9/02086; H03H 9/0509; H03H 9/1021; H03H 9/19; H03H 9/1071;
(Continued)

(56) References Cited

U.S. PATENT DOCUMENTS 6,417,574 B1    7/2002   Misawa et al.
2004/0226741 A1   11/2004   Masuko et al.
(Continued)

FOREIGN PATENT DOCUMENTS

JP      10-004155 A      1/1998
JP      2000-312060 A    11/2000
(Continued)

OTHER PUBLICATIONS

International Search Report and Written Opinion, PCT/JP2016/084125, Feb. 7, 2017, and English Translation (11 pages).

*Primary Examiner* — Thomas M Dougherty
(74) *Attorney, Agent, or Firm* — Volpe and Koenig, P.C.

(57) ABSTRACT

An electronic component housing package includes a base having a first principal face provided with a mounting section for mounting an electronic component; a frame having a second principal face, the frame being disposed on the base so as to surround the mounting section; a frame-shaped metallized layer disposed on the second principal face of the frame; and a side-surface conductor disposed on an inner side surface of the frame, the side-surface conductor connecting the frame-shaped metallized layer and a relay conductor formed on the first principal face, the side-surface conductor being covered with an insulating film from one end to the other end in a width direction of the side-surface conductor.

12 Claims, 5 Drawing Sheets

(51) Int. Cl.
  *H03H 9/02*    (2006.01)
  *H01L 23/02*   (2006.01)
  *H01L 23/04*   (2006.01)
  *H01L 23/049*  (2006.01)
  *H03H 9/10*    (2006.01)
  *H01L 23/498*  (2006.01)
  *H01L 23/528*  (2006.01)
  *H01L 23/552*  (2006.01)
  *H03H 9/05*    (2006.01)
  *H03H 9/19*    (2006.01)
  *H01L 23/13*   (2006.01)

(52) U.S. Cl.
  CPC ............ *H01L 23/049* (2013.01); *H01L 23/13* (2013.01); *H01L 23/49822* (2013.01); *H01L 23/49838* (2013.01); *H01L 23/5286* (2013.01); *H01L 23/552* (2013.01); *H03H 9/02102* (2013.01); *H03H 9/02133* (2013.01); *H03H 9/0509* (2013.01); *H03H 9/1021* (2013.01); *H03H 9/19* (2013.01); *H01L 23/49805* (2013.01); *H01L 2924/16195* (2013.01); *H03H 9/1071* (2013.01)

(58) Field of Classification Search
  CPC ..... H03H 9/02133; H01L 23/02; H01L 23/04; H01L 23/049; H01L 23/13; H01L 23/49822; H01L 23/49838; H01L 23/5286; H01L 23/552; H01L 23/49805; H01L 2924/16195
  USPC ......................................... 310/340, 344, 348
  See application file for complete search history.

(56) References Cited

U.S. PATENT DOCUMENTS

| | | |
|---|---|---|
| 2011/0127655 A1 | 6/2011 | Fujii |
| 2015/0305160 A1 | 10/2015 | Funahashi et al. |
| 2016/0007447 A1 | 1/2016 | Funahashi et al. |

FOREIGN PATENT DOCUMENTS

| | | |
|---|---|---|
| JP | 2009-170499 A | 7/2009 |
| JP | 2011-009399 A | 1/2011 |
| JP | 2011-114192 A | 6/2011 |
| JP | 2011-171701 A | 9/2011 |
| JP | 2015-005713 A | 1/2015 |
| KR | 10-2004-0081310 A | 9/2004 |
| WO | 2014/115766 A1 | 7/2014 |

ELECTRONIC COMPONENT HOUSING PACKAGE, ELECTRONIC APPARATUS, AND ELECTRONIC MODULE

TECHNICAL FIELD

The present invention relates to an electronic component housing package for hermetically receiving therein an electronic component such as a piezoelectric oscillation device, and so forth.

BACKGROUND ART

Heretofore it has been customary to use, as an electronic component housing package for mounting an electronic component such as a piezoelectric oscillation device or a semiconductor device, a construction comprising an insulating substrate made of, for example, ceramic sintered body, which has a mounting section for receiving an electronic component. A lid body is joined to an upper surface of the insulating substrate so as to cover the mounting section. Such an electronic component housing package is basically composed of: an insulating substrate comprising a flat plate-shaped base having an electronic component mounting section at its upper surface, and a frame in the form of a frame laminated on an upper surface of the base so as to surround the mounting section; and wiring conductors formed in the range from the mounting section to a lower surface of the base and so forth.

Of the wiring conductors, one disposed in the mounting section functions as a connection conductor to which an electronic component is connected, whereas one disposed on the lower surface of the base (a lower surface of the insulating substrate) functions as a conductor for external connection (external connection conductor). An electronic apparatus is produced by mounting an electronic component in the mounting section while providing electrical connection between the connection conductor and each electrode of the electronic component, and thereafter sealing the mounting section with a lid body, for example. Moreover, an upper surface of the frame is provided with a frame-shaped metallized layer for the joining of a metal-made lid body. In this electronic component housing package, the lid body is joined to the frame-shaped metallized layer via a sealing material such as silver solder, thus hermetically sealing the electronic component in the mounting section.

There may be a case where the frame-shaped metallized layer and the lid body stand at the same potential as ground potential to obtain a structure in which an inside of the mounting section in which the electronic component is mounted is shielded from external noise. A method for obtaining such a structure involves, for example, placement of a side-surface conductor on the inner side surface of the frame, placement of a relay conductor connected to the external connection conductor set at the ground potential on the mounting section, and establishment of connection between the frame-shaped metallized layer and the external connection conductor set at the ground potential via the side-surface conductor or the relay conductor, for example (refer to Japanese Unexamined Patent Publication JP-A 2000-312060).

SUMMARY OF INVENTION

Technical Problem

However, in recent years, electronic component housing packages have come to be increasingly smaller. In keeping with this trend, the size of a clearance between individual wiring conductors disposed in the mounting section, or the width of the surrounding frame is on the decrease.

After all, in such a conventional case where the side-surface conductor is disposed on the inner side surface of the frame and the relay conductor connected to the side-surface conductor is disposed on the mounting section, due to a plating layer being deposited on the surface of each wiring conductor, a brazing material exhibits high enough wettability so as to spread easily through the side-surface conductor toward the relay conductor when joining the lid body to the frame-shaped metallized layer, wherefore a shortage of the volume of the brazing material may occur during sealing operation, which results in a decrease in sealing reliability, occurrence of electrical short-circuiting between different wiring conductors arranged proximate to each other caused by the spreading brazing material, and malfunctioning of the electronic component.

Solution to Problem

An electronic component housing package according to one aspect of the invention comprises: a base having a first principal face provided with a mounting section for mounting an electronic component; a frame having a second principal face, the frame being disposed on the base so as to surround the mounting section; a frame-shaped metallized layer disposed on the second principal face of the frame; and a side-surface conductor disposed on an inner side surface of the frame, the side-surface conductor connecting the frame-shaped metallized layer and a relay conductor formed on the first principal face, the side-surface conductor being covered with an insulating film from one end to the other end in a width direction of the side-surface conductor.

An electronic apparatus according to one aspect of the invention comprises: the electronic component housing package mentioned above; and an electronic component mounted in the electronic component housing package.

An electronic module according to one aspect of the invention comprises: the electronic apparatus mentioned above; and a module substrate connected with the electronic apparatus.

Advantageous Effects of Invention

According to one aspect of the invention, the electronic component housing package comprises: the base having the first principal face provided with the mounting section for mounting an electronic component; the frame having the second principal face, the frame being disposed on the base so as to surround the mounting section; the frame-shaped metallized layer disposed on the second principal face of the frame; and the side-surface conductor disposed on the inner side surface of the frame, the side-surface conductor connecting the frame-shaped metallized layer and the relay conductor formed on the first principal face, the side-surface conductor being covered with an insulating film from one end to the other end in the width direction of the side-surface conductor, and hence, during the adhesion of a lid body to the frame-shaped metallized layer by means of a brazing material or otherwise, the brazing material is restrained from spreading toward the mounting section through the side-surface conductor. This enables implementation of the electronic component housing package capable of reducing a decrease in sealing reliability resulting from a shortage of the volume of the brazing material, and occurrence of electrical short-circuiting between different wiring conductors arranged proximate to each other caused by the spreading brazing material.

According to one aspect of the invention, the electronic apparatus employs the above-described electronic component housing package, and can thus be implemented as an electronic apparatus which affords high operation reliability while reducing a decrease in sealing reliability and occurrence of electrical short-circuiting in the course of electronic component sealing operation.

According to one aspect of the invention, the electronic module employs the above-described electronic apparatus, and can thus be implemented as an electronic module having excellent operation reliability with improved sealing reliability for an electronic component mounted in the mounting section.

DESCRIPTION OF EMBODIMENTS

Figure 1A:
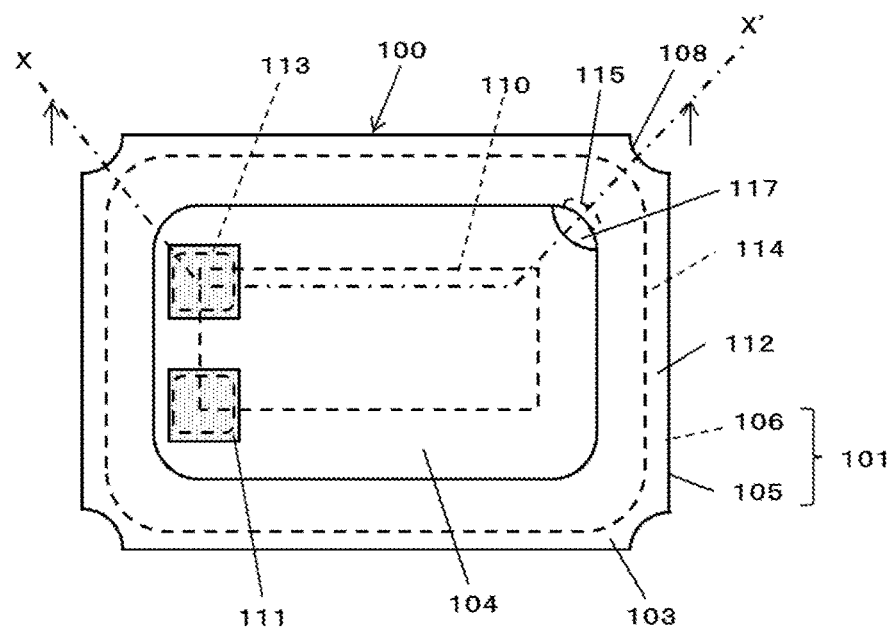
FIG. 1A is a transparent top view showing an electronic component housing package in accordance with an embodiment of the invention.

An electronic component housing package in accordance with an embodiment of the invention and so forth will be described with reference to accompanying drawings. FIG. 1A is a transparent top view showing an example of one embodiment of an electronic component housing package 100 according to the invention, and FIG. 1B is a transparent sectional view taken along the line X-X' shown in FIG. 1A.

Figure 1B:
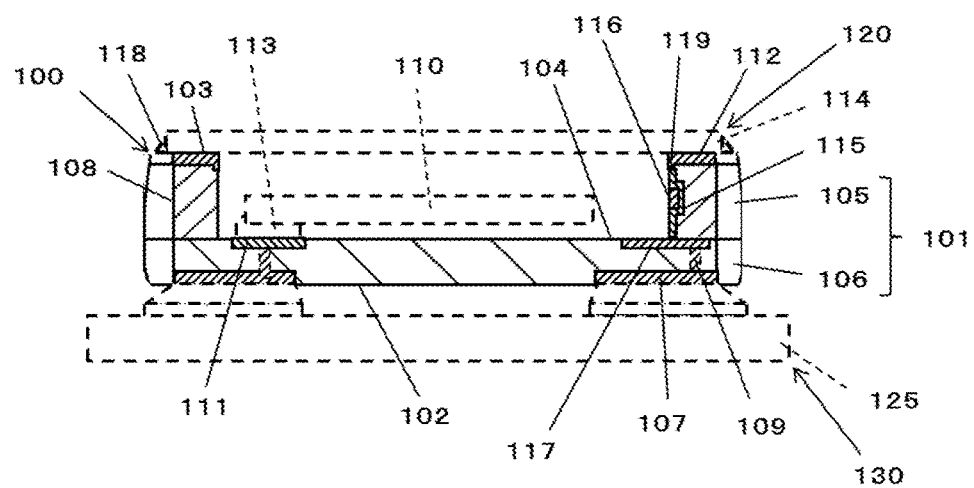
FIG. 1B is a transparent sectional view taken along the line X-X' shown in FIG. 1A.

In FIGS. 1A and 1B, the electronic component housing package 100 has a first principal face 102 serving as a mounting face for a module substrate 125 and a second principal face serving as a sealing face, and also has a mounting section 104 formed in an insulating substrate 101. An electronic component 110, such as a piezoelectric oscillation device, is mounted in the mounting section 104. The insulating substrate 101 comprises a frame 105 and a base 106 laminated to each other. Moreover, the corners in the outer periphery of the insulating substrate 101 are each provided with a cutaway 108. While the cutaway 108 is formed for the purpose of, for example, providing electrical connection between individual wiring substrate regions (not illustrated in the drawings) via an inner surface conductor (not illustrated) disposed on an inner side surface of the cutaway 108 in the course of production of the electronic component housing package 100, the electrical connection between the wiring substrate regions may be established by an internally provided wiring conductor without the necessity of providing the inner surface conductor, and, in this case, the formation of the cutaway 108 may be omitted depending on the configuration of an electronic apparatus 120 used.

A frame-shaped metallized layer 112 is formed on a second principal face 103 of the frame 105, and also a side-surface conductor 115 is disposed on an inner side surface of the frame 105. Moreover, a relay conductor 117 is disposed in a part of the mounting section 104 located immediately below the side-surface conductor 115 in the base 106. A conducting path is traced from the frame-shaped metallized layer 112 via the side-surface conductor 115 to the relay conductor 117, and, an external connection conductor 107 connected from the relay conductor 117 in the base 106 via a through conductor 109 is disposed on a lower surface of the insulating substrate 101.

The wiring substrate is, as exemplified, provided with the frame-shaped metallized layer 112 disposed on the second principal face 103 of the frame 105, and also a pair of connection conductors 111 located within the mounting section 104 and connected with the electronic component 110. Upon joining a lid body 114 onto the frame-shaped metallized layer 112 of the insulating substrate 101 via a brazing material 118 such as silver solder, the electronic component housing package 100 hermetically seals the electronic component 110.

In this embodiment, the insulating substrate 101 has the mounting section 104 shaped as a recess when viewed in a transparent sectional view in a thickness direction thereof. The electronic apparatus 120 is formed by hermetically sealing the electronic component 110 such as a piezoelectric oscillation device in the electronic component housing package 100. In FIGS. 1A and 1B, the lid body 114 for sealing the mounting section 104 is transparently represented for the sake of convenience.

The insulating substrate 101 is formed by laminating the frame 105 onto the base 106 in flat sheet form. Moreover, the frame 105 surrounds the mounting section 104 on an upper surface of the base 106 in plan configuration. The inner side surface of the frame 105 and a part of the base 106 exposed inside the mounting section 104 define the recess-shaped mounting section 104 for mounting the electronic component 110.

The frame 105 and the base 106 are each made of a ceramic material such for example as an aluminum oxide sintered body, an aluminum nitride sintered body, a mullite sintered body, or a glass-ceramic sintered body. For example, the insulating substrate 101 has the general shape of a rectangle which is about 1.6 to 10 mm on a side when seen in a plan view, is shaped as a plate having a thickness of about 0.3 to 2 mm, and has the recess-shaped mounting section 104 in its upper surface.

When the frame 105 and the base 106 are formed of an aluminum oxide sintered body, the insulating substrate 101 can be produced by admixing suitable organic binder, solvent, plasticizer, etc. in a powdery raw material such as aluminum oxide, silicon oxide, magnesium oxide, calcium oxide, etc. to prepare a slurry, shaping the slurry into sheets by sheet-molding technique such as a doctor blade method or a roll calender method to obtain a plurality of ceramic green sheets, shaping part of the ceramic green sheets into a frame-shaped sheet by suitable punching process, vertically stacking the ceramic green sheets so that the frame-shaped ceramic green sheet lies on an upper surface of a flat-plate-like ceramic green sheet which is not formed in a frame shape, and the step of firing the stacked body at high temperature.

With respect to the insulating substrate 101, for example, there is prepared a matrix substrate (not illustrated) including an arrangement of substrate regions that become separate insulating substrates 101, whereafter the matrix substrate is divided into pieces to obtain the individual insulating substrates 101. The matrix substrate comprises a flat-plate-like insulating layer including a plurality of base 106-forming regions (not illustrated) and an insulating layer including a plurality of frame 105-forming regions (an arrangement of a plurality of openings) (not illustrated).

The frame 105 may be configured to have the frame-shaped metallized layer 112 on its upper surface and the cutaways 108 in its outer periphery. Moreover, in the base 106, as an electrically conducting path for providing electrical connection between the electronic component 110 mounted in the mounting section 104 and an external electric circuit of the module substrate 125, there are provided the connection conductor 111, the through conductor 109, the side-surface conductor 115, the relay conductor 117, and the external connection conductor 107. Moreover, while the cutaway 108 is formed in the corner part of the insulating substrate 101 in this exemplification, there may be a case where the cutaway 108 is formed in the rest part of the outer side of the insulating substrate 101 corresponding to the longer side or the shorter side of the insulating substrate 101.

When a plurality of electronic components (not illustrated) such as TCXO (Temperature Compensated Crystal Oscillator) is mounted on the mounting section 104 in the electronic apparatus, in order to provide an inner side surface of stepped configuration for mounting a plurality of the electronic components, there may be a case where the frame 105 is composed of two or more insulating layers.

For example, the mounting section 104 is rectangular when seen in a plan view in conformity with the rectangular form of the electronic component 110. In the exemplification shown in FIGS. 1A and 1B, there are provided paired connection conductors 111 located in the two adjacent corner parts, respectively, of the rectangular mounting section 104. The connection conductor 111 functions as a conductor layer for connection with an electrode (not illustrated) of the electronic component 110 such as a piezoelectric oscillation device mounted in the mounting section 104. Where the electronic component 110 is a piezoelectric oscillation device, in general, its outer shape is rectangular seen in a plan view, and, in the corner parts of the principal face of the component, a pair of electrodes for connection purposes (not illustrated) is provided. The connection conductor 111 is thus disposed in the corner part of the mounting section 104 to achieve easy and reliable connection of such an electrode.

Each electrode of the electronic component 110 and the connection conductor 111 are connected to each other via a joining material 113 such as an electrically conductive adhesive. That is, as shown in FIG. 1A, the electronic component 110 is set in position in the mounting section 104 so that the paired electrodes disposed in the corner parts of the principal face of the electronic component 110 are each opposed to corresponding one of the paired connection conductors 111 disposed on the mounting section 104, and then the joining material 113 that has previously adhered to the connection conductor 111 is cured under heat, whereupon the electrode of the electronic component 110 and the connection conductor 111 are connected to each other.

Since the embodiment has thus far been described with respect to the case where a piezoelectric oscillation device exemplifies the electronic component 110, the connection conductor 111 is placed in a position as described above, and yet, in the case of mounting an electronic component of other type (not illustrated) or a plurality of other electronic components, the position or the shape of the connection conductor 111 may be changed in accordance with the arrangement of the electrodes of the electronic component to be mounted. Examples of such other electronic components include a piezoelectric device such as a ceramic piezoelectric device or a surface acoustic wave device, a semiconductor device, a capacitance device, and a resistor device.

The electronic component housing package 100 in accordance with the embodiment of the invention comprises: the base 106 having the first principal face 102 provided with the mounting section 104 for mounting the electronic component 110; the frame 105 having the second principal face 103 and disposed on the base 106 so as to surround the mounting section 104; the frame-shaped metallized layer 112 disposed on the second principal face 103 of the frame 105; and the side-surface conductor 115 disposed on the inner side surface of the frame 105 and connecting the frame-shaped metallized layer 112 and the relay conductor 117 formed on the first principal face 102, and also, the side-surface conductor 115 is covered with an insulating film 116 from one end to the other end in the width direction of the side-surface conductor 115.

Figure 2:
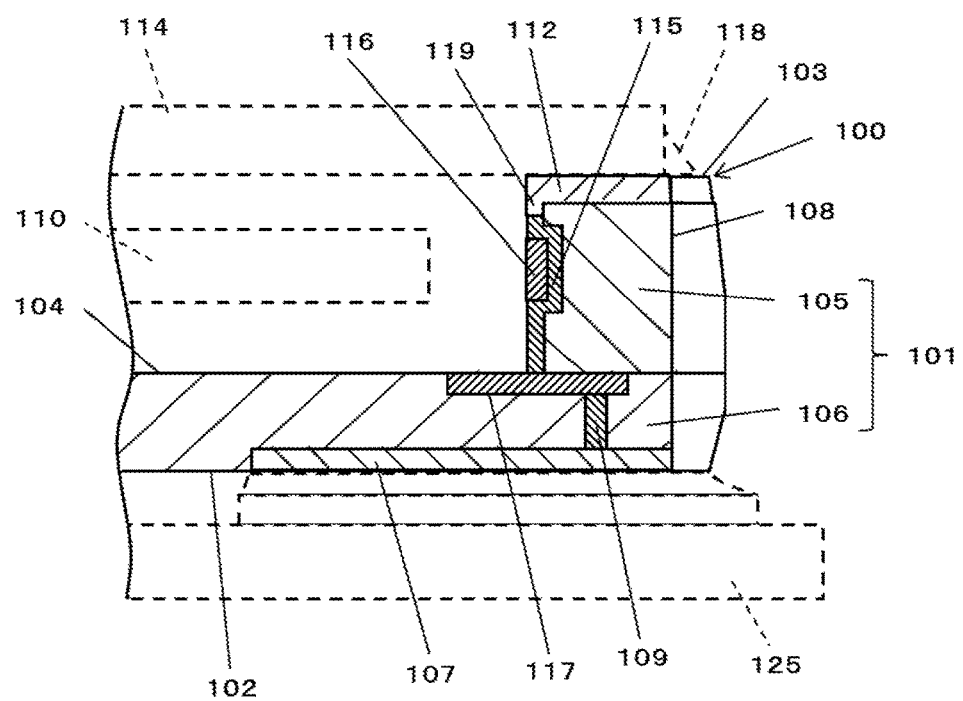
FIG. 2 is a transparent sectional view showing the major part of the electronic component housing package in accordance with the embodiment of the invention.
Figure 3:
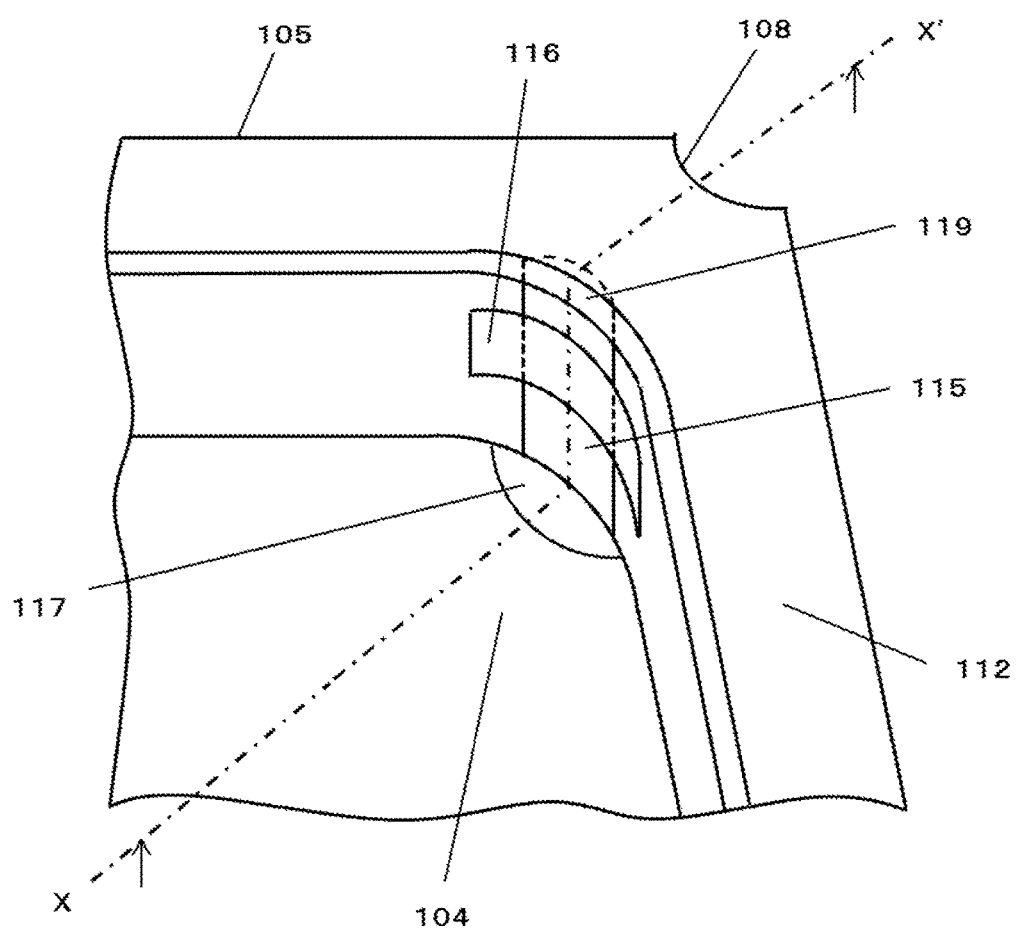
FIG. 3 is a perspective view showing the major part of the electronic component housing package in accordance with the embodiment of the invention.

With such a configuration, during the adhesion of the lid body 114 to the frame-shaped metallized layer 112 by means of the brazing material 118 or otherwise, the brazing material 118 is restrained from spreading toward the mounting section 104 through the side-surface conductor 115. This enables implementation of the electronic component housing package 100 capable of reducing a decrease in sealing reliability resulting from a shortage of the volume of the brazing material 118, and occurrence of electrical short-circuiting between different wiring conductors arranged proximate to each other (not illustrated) caused by the spreading brazing material 118. An exemplification of the above-described electronic component housing package 100 is shown in FIGS. 1A and 1B. Moreover, FIG. 2 represents a transparent sectional view of the major part of the construction shown in FIGS. 1A and 1B. In addition, FIG. 3 represents a perspective view of the construction shown in FIG. 2, illustrating the side surface of the frame 105 as seen from the mounting section 104.

In the interest of preventing oxidative corrosion and facilitating or strengthening the connection between the connection conductor 111 and the electrode of the electronic component 110, or the connection between the external connection conductor 107 and the module substrate 125 for example, it is advisable that exposed surfaces of the connection conductor 111, the frame-shaped metallized layer 112, the side-surface conductor 115, the relay conductor 117, the external connection conductor 107, etc. are deposited successively with a nickel plating layer having a thickness of about 1 μm to 20 μm and a gold plating layer having a thickness of about 0.1 μm to 3.0 μm.

In the case where the exposed surface of each wiring conductor is deposited with a plating layer, when the lid body 114 is joined to the frame-shaped metallized layer 112 on the insulating substrate 101 via the brazing material 118 such as silver solder in order to hermetically seal the electronic component 110, the sealing material tends to spread through the plating layer, and yet, even in a case where the sealing material finds its way into the mounting section 104 through the side-surface conductor 115, since the insulating film 116 is configured to cover the side-surface conductor 115 from one end to the other end in the width direction thereof, and the insulating film 116 is not wet by the brazing material 118, it is possible to restrain the brazing material 118 from spreading toward the mounting section 104 through the side-surface conductor 115. This enables implementation of the electronic component housing package 100 capable of reducing occurrence of electrical short-circuiting between different wiring conductors arranged proximate to each other caused by the brazing material 118 spreading toward the mounting section 104.

Each of the side-surface conductor 115 and the relay conductor 117 is not limited in placement position to the corner part of the outer periphery of the mounting section 104 as shown in FIGS. 1A and 1B, but may be disposed in other part corresponding to the shorter side or the longer side of the mounting section 104 of the electronic component housing package 100, depending on the configuration of the applied electronic apparatus 120. Moreover, the insulating film 116 is not limited in shape to the rectangular form as shown in FIG. 3, but may be given a circular shape or an elliptical shape. Configuring the insulating film 116 to have a rounded outer edge is effective in preventing separation of the insulating film 116 from the frame 105. Furthermore, if the insulating film 116 covers part of the frame 105 located on the second principal face 103 side (sealing face side), the seal width of the lid body 114 and the frame-shaped metallized layer 112 is reduced, and therefore such a configuration is not preferable. It is hence important to form the insulating film 116 in such a position as not to cause a reduction in the seal width. For example, when the insulating film 116 covers part of an extended part 119 of the frame-shaped metallized layer 112, the seal width of the lid body 114 and the frame-shaped metallized layer 112 is not reduced by the insulating film 116.

To provide the inner side surface of the frame 105 with the side-surface conductor 115 and the insulating film 116 which covers the side-surface conductor 115 from one end to the other end in the width direction thereof, for example, metallizing pastes for forming the frame-shaped metallized layer 112, the side-surface conductor 115, and the relay conductor 117, respectively, are each formed at a predetermined position in the insulating substrate 101-constituting ceramic green sheet, and also a ceramic paste for forming the insulating film 116 is formed at a predetermined position on the upper surface of the side-surface conductor 115-forming metallizing paste in order that the insulating film 116 can cover the side-surface conductor 115 from one end to the other end in the width direction thereof. It is preferable that the ceramic paste is made of a material which is substantially the same as that used for the insulating substrate 101. The same material refers to one which contains the same ceramic component as that constitutes the insulating substrate 101 after firing operation, and, in preparing this ceramic paste, the amounts of a binder and a solvent to be added to the ceramic material are adjusted properly in accordance with the specification of paste application technique in use (for example, screen printing method).

Moreover, a pressurizing jig profiled with a convexity and a concavity (not illustrated) is operated to exert pressure on the surface of the insulating substrate 101-constituting ceramic green sheet provided with the metallizing paste and the ceramic paste in order to form the mounting section 104 in recess form. At this time, the pressurizing jig is positioned so as to pressurize a part of the ceramic green sheet which becomes the bottom of the mounting section 104, whereby a part of the ceramic green sheet pressed by the convexity of the pressurizing jig becomes the mounting section 104, and a part of the ceramic green sheet pressed by the concavity of the pressurizing jig becomes the frame 105. Then, upon the side-surface conductor 115-forming metallizing paste and the relay conductor 117-forming metallizing paste being pressed by the convexity, the side-surface conductor 115 is formed on the inner side surface of the frame 105, and the relay conductor 117 is formed on a part of the mounting section 104 located immediately below the frame 105. Moreover, the connection conductor 111, which is formed on the mounting section 104, can be formed through process steps similar to those for forming the relay conductor 117. By using, as the binder added to the ceramic green sheet, the metallizing paste, and the ceramic paste in use, one whose glass-transition temperature is lower than or equal to the temperature at which pressurization is effected by the pressurizing jig, it is possible to shape the frame 105, the side-surface conductor 115, etc. into desired forms during the pressurizing operation on the ceramic green sheets, etc. using the pressurizing jig.

At this time, the concavity of the pressurizing jig has uniform width and depth, and the frame 105 which has undergone pressurizing operation has uniform width and height correspondingly. In a heretofore conventional process comprising forming a through hole in the frame 105 in advance, filling the through hole with a metallizing paste, forming the side-surface conductor by subjecting part of the through hole to punching process using a die or the like, and applying a ceramic paste for forming the insulating film onto the surface of the side-surface conductor, the frame width is increased by an amount corresponding to the thickness of the applied ceramic paste, and, in this regard, according to the above-described process steps, even when the insulating film 116 is formed on the surface of the side-surface conductor 115, by virtue of the uniform width of the frame 105 in a pressurized condition, greater dimensional accuracy can be attained. Thus, the base 106 provided with the connection conductor 111 and the relay conductor 117, and the frame 105 provided with the frame-shaped metallized layer 112 and the side-surface conductor 115 are integrally formed to obtain a ceramic green sheet formed body, and, the matrix substrate (not illustrated) including an arrangement of a plurality of wiring substrate regions for constituting the electronic component housing package 100 can be produced from the ceramic green sheet formed body.

Although the matrix substrate is, as exemplified, produced through the process of pressurizing the flat-plate-like ceramic green sheets to form the frame 105 and the base 106 together at one time, the matrix substrate may be produced by stacking the frame 105 and the base 106 that have been prepared as separate components in advance. In this case, the insulating substrate 101 of complex form can be produced from a plurality of ceramic green sheets.

Moreover, the electronic component housing package 100 in accordance with the embodiment of the invention is characterized in that part of the frame-shaped metallized layer 112 is formed as the extended part 119 located on the inner side surface of the frame 105, and the surface of the extended part 119 and the surface of the insulating film 116 lie on one and the same plane. With such a configuration, the side surface of the frame 105 is free of a stepped portion entailed by the placement of the insulating film 116, wherefore a stress is hard to be applied to the insulating film 116 when the electronic component 110 is mounted in the mounting section 104 or due to, for example, thermal expansion or thermal contraction ascribable to a temperature environment in which the electronic component housing package 100 is put into service, and the insulating film 116 can thus be restrained from separation. Moreover, the mounting section 104 can be configured to have a large enough opening so as to implement a construction having excellent mounting capability of the electronic component 110.

Thus, as shown in FIGS. 2 and 3, in this construction, the inner side surface of the frame 105 is provided with the side-surface conductor 115 and the insulating film 116 which covers the side-surface conductor 115 from one end to the other end in the width direction thereof, and the side-surface conductor 115 covered with the insulating film 116 is embedded within the frame 105, and also, the surface of the extended part 119 of the frame-shaped metallized layer 112 and the surface of the insulating film 116 lie on one and the same plane. Even in cases where part of the side-surface conductor 115 is exposed at the side surface of the frame 105, and, the surface of the extended part 119 of the frame-shaped metallized layer 112, the surface of the insulating film 116, and the surface of the side-surface conductor 115 lie on one and the same plane, since the insulating film 116 is disposed so as to cover the side-surface conductor 115 from one end to the other end in the width direction thereof, the insulating film 116 is not wet by the brazing material 118, and therefore it is possible to restrain the brazing material 118 from spreading toward the mounting section 104 through the side-surface conductor 115 which extends from the extended part 119 of the frame-shaped metallized layer 112 to the insulating film 116, straddles the insulating film 116, and extends in an exposed state over a mounting section 104-side part of the side surface. This enables implementation of the electronic component housing package 100 capable of reducing occurrence of electrical short-circuiting between different wiring conductors arranged proximate to each other caused by the brazing material 118 spreading toward the mounting section 104, and thus providing excellent mounting capability of the electronic component 110. In a case where part of the surface of the extended part 119 of the frame-shaped metallized layer 112 or the surface of the side-surface conductor 115 is exposed, the exposed part of such a wiring conductor may be deposited with a plating layer such as a nickel plating layer or a gold plating layer, and, in this case, although the surface of the wiring conductor bulges toward the mounting section 104 to an extent corresponding to the thickness of the plating layer, the bulge does not conduce the spreading of the brazing material 118 toward the mounting section 104.

Examples of the electronic component 110 mounted in the mounting section 104 include a piezoelectric oscillation device such as a crystal oscillator. Electrical connection of the piezoelectric oscillation device to the connection conductor 111 is effected by the electrically conductive joining material 113. For example, the joining material 113 is a conductive adhesive with conductive particles formed of a conductive material such as silver added.

The frame-shaped metallized layer 112 including the extended part 119, and the side-surface conductor 115 are electrically connected to each other, and are connected to the external connection conductor 107 disposed on the first principal face 102 serving as a mounting face via the relay conductor 117 disposed in the mounting section 104 and the through conductor 109 disposed in the base 106. With such a configuration, the frame-shaped metallized layer 112 and the lid body 114 stand at the same potential as ground potential, in consequence whereof there results a structure in which an inside of the mounting section 104 in which the electronic component 110 is mounted is shielded from external noise.

Moreover, the electronic component housing package 100 in accordance with the embodiment of the invention is characterized in that the insulating film 116 continuously covers a region extending from the side-surface conductor 115 to the relay conductor 117. With such a configuration, the side surface of the frame 105 is free of a stepped portion entailed by the placement of the insulating film 116, wherefore a stress is hard to be applied to the insulating film 116 when the electronic component 110 is mounted in the mounting section 104 or due to thermal expansion or thermal contraction for example, and the insulating film 116 can thus be restrained from separation. Moreover, the side-surface conductor 115 and the relay conductor 117 can be restrained from separation under a stress applied thereto when the electronic component 110 is mounted in the mounting section 104. Besides, the mounting section 104 can be configured to have a large opening and a stepped portion-free surface, and thus can provide a large enough housing area so as to achieve more effective implementation of the electronic component housing package 100 having excellent mounting capability of the electronic component 110.

Figure 4:
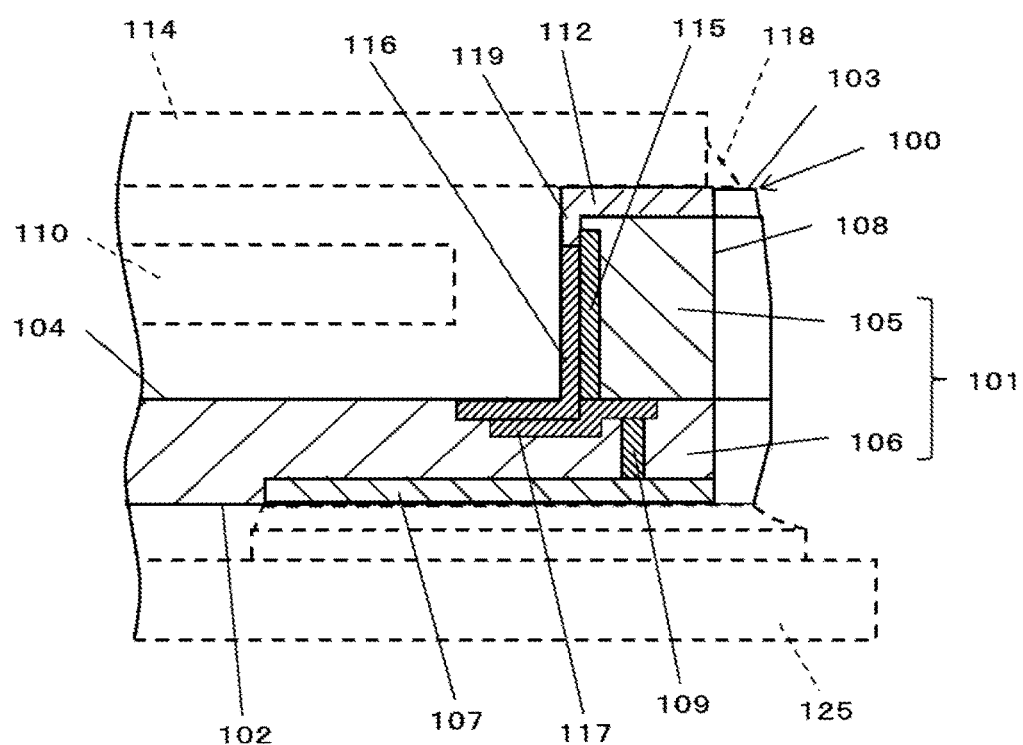
FIG. 4 is a transparent sectional view showing the major part of the electronic component housing package in accordance with another embodiment of the invention.
Figure 5:
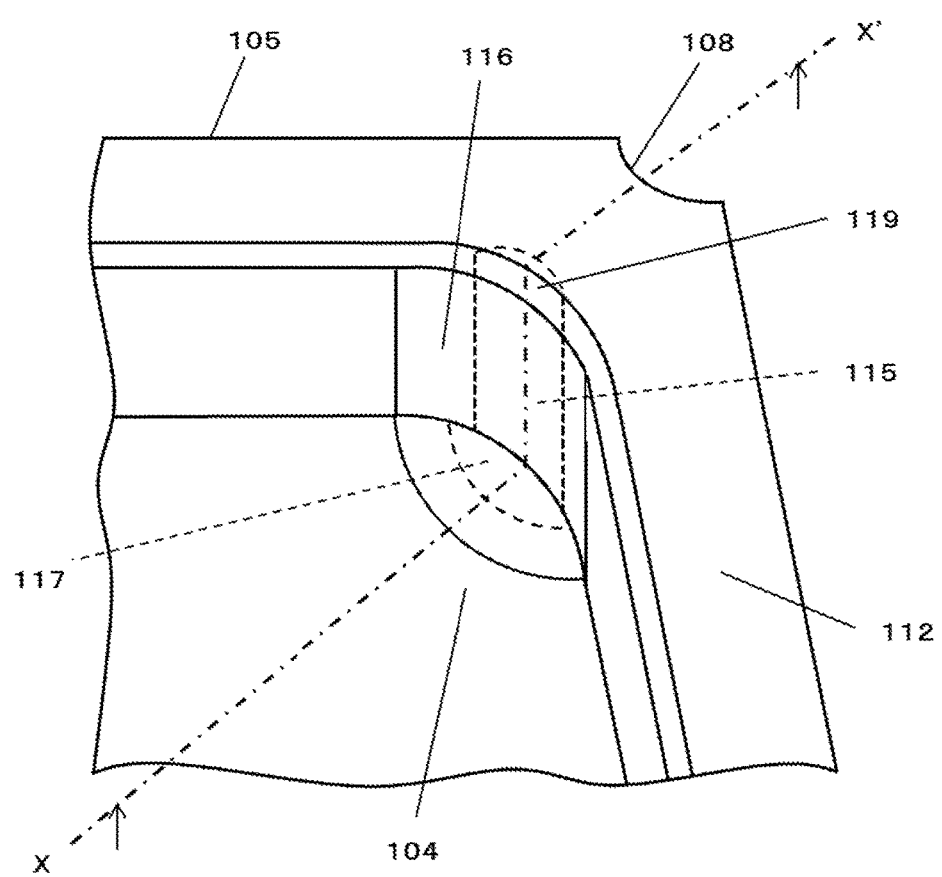
FIG. 5 is a perspective view showing the major part of the electronic component housing package in accordance with another embodiment of the invention.

Thus, as shown in FIGS. 4 and 5, in this construction, the inner side surface of the frame 105 is provided with the side-surface conductor 115 and the insulating film 116 which covers the side-surface conductor 115 from one end to the other end in the width direction thereof, and the side-surface conductor 115 covered widely with the insulating film 116 is embedded within the frame 105, and, where the relay conductor 117 disposed in the mounting section 104 is concerned, the relay conductor 117 covered widely with the insulating film 116 is also embedded within the mounting section 104. Moreover, the surface of the extended part 119 of the frame-shaped metallized layer 112 and the surface of the insulating film 116 lie on one and the same plane, and, the surface of the mounting section 104 and the surface of the insulating film 116 lie on one and the same plane.

Hence, even when the wiring conductor such as the side-surface conductor 115, the relay conductor 117, etc. is disposed in the mounting section 104, as well as at the frame 105, the wiring conductor is embedded within the mounting section 104 or the frame 105, wherefore the placement of the wiring conductor does not lead to a decrease in the opening dimensions and the depth of the mounting section 104. This makes it possible to reduce the possibility that, when the electronic component 110 such as a piezoelectric oscillation device is mounted in the mounting section 104, the electronic component 110 is brought into contact with the side surface of the frame 105 or the wiring conductor and so forth disposed in the mounting section 104.

Moreover, by configuring the insulating film 116 to cover the side-surface conductor 115 and the relay conductor 117 so that no exposed part of the side-surface conductor 115 and the relay conductor 117 exists, electrical short-circuiting which occurs between different wiring conductors arranged proximate to each other due to the brazing material 118 spreading toward the mounting section 104 is more effectively suppressed. That is, even if the brazing material 118 reaches the mounting section 104 free of level differences, since the relay conductor 117 is wholly covered with the insulating film 116, and, like the base 106, the insulating film 116 is not wet by the brazing material 118, the brazing material 118 is restrained from spreading over the mounting section 104, and thereby occurrence of electrical short-circuiting between different wiring conductors arranged proximate to each other is reduced.

Although, in this construction, a single relay conductor 117 in sector form is disposed in the corner part of the outer periphery of the mounting section 104 as shown in FIG. 1A, for example, a plurality of semicircular- or rectangular-shaped relay conductors may be disposed in other locations of the outer periphery of the mounting section 104 without limitation in conformity with the configuration of the applied electronic apparatus 120.

The electronic apparatus 120 in accordance with the embodiment of the invention comprises: any one of the above-described electronic component housing packages 100; and the electronic component 110 mounted in the electronic component housing package 100.

With this construction, the side surface of the frame 105 is free of a stepped portion entailed by the placement of the insulating film 116, a stress is hard to be applied to the insulating film 116 when the electronic component 110 is mounted in the mounting section 104 or due to thermal expansion or thermal contraction for example, and the insulating film 116 can thus be restrained from separation. Moreover, the use of the electronic component housing package 100 in which the mounting section 104 has a large enough opening so as to provide excellent mounting capability of the electronic component 110, enables implementation of an apparatus which affords excellent operation reliability while reducing the possibility of contact between the mounted electronic component 110 and the brazing material 118 serving as the sealing material, or the possibility of electrical short-circuiting which occurs between different wiring conductors arranged proximate to each other.

Thus, during the adhesion of the lid body 114 to the frame-shaped metallized layer 112 of the electronic component housing package 100 by means of the brazing material 118 or otherwise, the brazing material 118 can be restrained from spreading toward the mounting section 104 through the side-surface conductor 115, wherefore a decrease in sealing reliability resulting from a shortage of the volume of the brazing material 118, as well as occurrence of electrical short-circuiting between different wiring conductors arranged proximate to each other caused by the spreading brazing material 118, is reduced, and hence the electronic apparatus 120 having excellent operation reliability is implemented.

Examples of the electronic apparatus 120 include a piezoelectric oscillator in which a piezoelectric oscillation device such as a crystal oscillator is mounted in the mounting section 104 of the electronic component housing package 100. The piezoelectric oscillation device is hermetically sealed in the housing composed of the mounting section 104 and the lid body 114, thus constituting the electronic apparatus 120. The electronic component 110 which is mounted in the mounting section 104 of the electronic component housing package 100 also includes the electronic apparatus 120 in which, not only the piezoelectric oscillation device, but also an IC and other electronic components (not illustrated) are mounted.

More specific examples include: an electronic apparatus in which a temperature compensating IC is mounted in the vicinity of the piezoelectric oscillation device in the interest of more accurate temperature compensation for the piezoelectric oscillation device mounted in the mounting section 104; and an electronic apparatus in which a thermistor device is mounted in the vicinity of the piezoelectric oscillation device. After such electronic components 110 is housed in the mounting section 104 of the electronic component housing package 100, the lid body 114 is joined to the frame 105 of the electronic component housing package 100 so as to cover the mounting section 104, whereupon the piezoelectric oscillation device and so forth are hermetically sealed in the mounting section 104.

An electronic module 130 in accordance with the embodiment of the invention comprises: the above-described electronic apparatus 120; and the module substrate 125 connected with the electronic apparatus 120. With this construction, the electronic module 130 employing the electronic apparatus 120 which affords excellent operation reliability while reducing the possibility of contact between the mounted electronic component 110 and the brazing material 118 serving as the sealing material, or the possibility of electrical short-circuiting which occurs between individual wiring conductors can be implemented.

When such an electronic module 130 is mounted in an electronic instrument (not illustrated), by setting the frame-shaped metallized layer 112 and the lid body 114 to stand at the same potential as ground potential, there is provided a structure in which an inside of the mounting section 104 is shielded from external noise. That is, the amount of external electromagnetic waves that reach the electronic component 110 housed in the mounting section 104 can be reduced. In other words, the electronic module 130 is configured to be able to reduce an amount of electromagnetic waves from the electronic instrument, and thereby suppress influences of electromagnetic waves from the electronic instrument. As described heretofore, in the electronic component housing package 100 for use in the electronic module 130 in accordance with the embodiment of the invention, the inner side surface of the frame 105 is provided with the side-surface conductor 115, and the insulating film 116 which covers the side-surface conductor 115 from one end to the other end in the width direction thereof. Moreover, the side-surface conductor 115 covered with the insulating film 116 is embedded within the frame 105, and, the surface of the extended part 119 of the frame-shaped metallized layer 112 and the surface of the insulating film 116 lie on one and the same plane. With this construction, the side-surface conductor 115, which serves as an electrically conducting path for setting the frame-shaped metallized layer 112 and the lid body 114 to stand at the same potential as ground potential, is restrained from separating from the frame 105 and protected against a break, and hence it is possible to implement a structure in which the electronic component 110 mounted in the mounting section 104 is shielded from external noise more effectively, and thereby implement the electronic module 130 resistant to external noise influence.

It is noted that the present disclosure is not limited to the above-described embodiments, and thus various changes and modifications are possible without departing from the scope of the invention. For example, while, in the electronic component housing package 100, the mounting section 104 is constituted by a single recess, the mounting section 104 may be constituted by a plurality of recesses. Moreover, while the recess is formed on the second principal face 103 side, there may be produced the electronic component housing package 100 in which recesses are formed not only on the second principal face 103 side, but also on the first principal face 102 side to provide the mounting section 104, wherein the electronic component housing package 100 is of a so-called H-shaped profile when seen in a vertically sectional view.

The invention claimed is:

1. An electronic component housing package, comprising:
   a base having a first principal face provided with a mounting section for mounting an electronic component;
   a frame having a second principal face, the frame being disposed on the base so as to surround the mounting section;
   a frame-shaped metallized layer disposed on the second principal face of the frame; and
   a side-surface conductor disposed on an inner side surface of the frame, the side-surface conductor connecting the frame-shaped metallized layer and a relay conductor formed on the first principal face,
   the side-surface conductor being covered with an insulating film from one end to the other end in a width direction of the side-surface conductor.

2. The electronic component housing package according to claim 1,
   wherein part of the frame-shaped metallized layer is formed as an extended part located on the inner side surface of the frame, and a surface of the extended part and a surface of the insulating film lie on one and a same plane.

3. The electronic component housing package according to claim 2,
   wherein part of a surface of the side-surface conductor lies on the one and the same plane.

4. The electronic component housing package according to claim 1,
   wherein the insulating film continuously covers a region extending from the side-surface conductor to the relay conductor.

5. The electronic component housing package according to claim 1,
   wherein the insulating film covers the side-surface conductor and the relay conductor so that no exposed part of the side-surface conductor and the relay conductor exists.

6. An electronic apparatus, comprising:
   the electronic component housing package according to claim 1; and
   an electronic component mounted in the electronic component housing package.

7. An electronic module, comprising:
   the electronic apparatus according to claim 6; and
   a module substrate connected with the electronic apparatus.

8. The electronic component housing package according to claim 2,
   wherein the insulating film continuously covers a region extending from the side-surface conductor to the relay conductor.

9. The electronic component housing package according to claim 3,
   wherein the insulating film continuously covers a region extending from the side-surface conductor to the relay conductor.

10. The electronic component housing package according to claim 2,
    wherein the insulating film covers the side-surface conductor and the relay conductor so that no exposed part of the side-surface conductor and the relay conductor exists.

11. The electronic component housing package according to claim 4,
    wherein the insulating film covers the side-surface conductor and the relay conductor so that no exposed part of the side-surface conductor and the relay conductor exists.

12. The electronic component housing package according to claim 8,
    wherein the insulating film covers the side-surface conductor and the relay conductor so that no exposed part of the side-surface conductor and the relay conductor exists.

* * * * *